(12) United States Patent
Pezeshki et al.

(10) Patent No.: US 12,360,219 B2
(45) Date of Patent: Jul. 15, 2025

(54) MICROLED BASED TIME OF FLIGHT SYSTEM

(71) Applicant: AvicenaTech Corp., Sunnyvale, CA (US)

(72) Inventors: Bardia Pezeshki, Mountain View, CA (US); Robert Kalman, Mountain View, CA (US); Alexander Tselikov, Mountain View, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 914 days.

(21) Appl. No.: 17/401,919

(22) Filed: Aug. 13, 2021

(65) Prior Publication Data

US 2022/0050186 A1 Feb. 17, 2022

Related U.S. Application Data

(60) Provisional application No. 63/065,907, filed on Aug. 14, 2020.

(51) Int. Cl.
| | |
|---|---|
| *G01S 7/4865* | (2020.01) |
| *H10H 20/857* | (2025.01) |
| *H10H 29/14* | (2025.01) |
| *H10H 20/811* | (2025.01) |

(52) U.S. Cl.
CPC ......... *G01S 7/4865* (2013.01); *H10H 20/857* (2025.01); *H10H 29/142* (2025.01); *H10H 20/811* (2025.01)

(58) Field of Classification Search
CPC ..... G01S 7/4865; H01L 27/156; H01L 33/62; H01L 33/04
See application file for complete search history.

(56) References Cited

U.S. PATENT DOCUMENTS

| | | |
|---|---|---|
| 9,793,427 B1 | 10/2017 | Gani |
| 10,629,689 B1 | 4/2020 | Raring et al. |
| 2012/0273758 A1* | 11/2012 | Komada ............... H01L 33/06 257/13 |
| 2019/0189603 A1 | 6/2019 | Wang et al. |
| 2020/0028000 A1* | 1/2020 | Wang .................... H01L 31/09 |
| 2020/0052158 A1 | 2/2020 | Bour et al. |
| 2020/0116862 A1 | 4/2020 | Xu et al. |

FOREIGN PATENT DOCUMENTS

| | | |
|---|---|---|
| EP | 28881753 | 6/2015 |
| JP | 2019-100919 A | 6/2019 |

OTHER PUBLICATIONS

International Search Report on related PCT Application No. PCT/US2021/045926 from International Searching Authority (KIPO) dated Dec. 1, 2021.
Written Opinion on related PCT Application No. PCT/US2021/045926 from International Searching Authority (KIPO) dated Dec. 1, 2021.

(Continued)

*Primary Examiner* — Anne M Hines

(57) ABSTRACT

A time of flight system may include one or more microLEDs and a photodetector monolithically integrated with integrated circuitry of the time of flight system. The microLEDs may be doped to provide increased speed of operation.

16 Claims, 6 Drawing Sheets

(56) References Cited

OTHER PUBLICATIONS

Extended European Search Report by European Patent Office in related EP Application No. 21856780.8 dated Jun. 26, 2024.
Bhatnagar et al., Pump-Probe Measurements of CMOS Detector Rise Time in the Blue, Journal of Lightwave Technology, vol. 22, No. 9, pp. 2213-2217, Sep. 2004.
Carreira et al., Direct Integration of Micro-LEDs and a Spad Detector on Asilicon CMOS Chip for Data Communications and Time-of-Flight Ranging, Optics Express, vol. 28, No. 5, pp. 6909-6917, Mar. 2, 2020.

* cited by examiner

MICROLED BASED TIME OF FLIGHT SYSTEM

CROSS-REFERENCE TO RELATED APPLICATIONS

This application claims the benefit of U.S. Provisional Patent Application No. 63/065,907, filed on Aug. 14, 2020, the disclosure of which is incorporated by reference herein.

FIELD OF THE INVENTION

The invention relates generally to optical range finding, and more particularly to optical range finding methods and apparatus utilizing microLEDs as light sources.

BACKGROUND OF THE INVENTION

Optical time of flight (ToF) systems are used commonly for range finding applications. The simplest method is to pulse a laser and measure the time for the pulse to return. More complex systems are built that can scan a laser beam and generate a 3 dimensional map, or form an image on a special sensor that measures the time delay per pixel. Often a 50% duty cycle pulse train is used and each pulse measures the overlap of a received pulse train from a transmitted one to measure relative phase. To obtain accurate measurements, generally a fast optical source is used, to provide either a narrow pulse or at least a sharp turn-on or turn-off characteristic.

Additionally, fast and simple detectors are generally desired to accurately measure low levels of light. SPADs (single photon avalanche detectors) are frequently used as they may provide the highest sensitivity. For systems in the infra-red, the detectors are generally complex and not fully compatible with CMOS. Thus a fairly complex assembly of three chips may be required, with a detector chip either in a different silicon process or in a compound semiconductor; a second chip that is usually a microcontroller that has a pulse generator and an amplifier for the detector; and a third chip for the compound semiconductor laser, often a vertical cavity surface emitting laser (VCSEL) made in GaAs.

These ToF modules are finding uses in diverse markets, from a proximity sensor on a cell phone that detects its proximity to the user, to navigational aids for service robots and vacuum cleaners, to landing assistance for drones, to smart shelves and smart buildings, to autofocus cameras. Each of these markets has different price and performance target. Thus, a technology that can increase the performance or reduce the cost of such a system is highly desirable.

One of the key cost drivers of such systems is the laser diode itself. VCSELs are quite fast, but have a relatively complex structure of multi-layer mirrors and can be comprised of over 100 precision layers. High yields tend to be challenging to obtain, and the devices typically have a threshold current over 1 mA and cannot run at high temperatures. Edge-emitting lasers, though they can generate higher optical powers, consume much higher power and are generally larger and more expensive. A combined CW laser and a modulator is usually prohibitively complex and expensive, and LEDs are generally too slow.

On the detector side, SPADs, or even avalanche photodiodes (APDs), usually have a thick silicon absorption and multiplication layer, and are not compatible with the process used to generate the electronic IC, so generally the SPADs or APDs are fabricated and packaged separately. If the laser source is emitting at a long wavelength, silicon is not absorbing and a different material such as germanium or InGaAs may have to be used, once again necessitating a second more expensive chip. Given that many applications, such as the use of these devices as proximity sensors, generally require very low price points, use of these technologies can be prohibitive.

To form a 3D map that includes depth, there are at least three potential techniques. A single optical source and a single detector can be used, if there is a method to scan the beam in x and y. Alternatively, a linear array of sources or detectors may be used, with the scanning along the one orthogonal axis. Scanning in one axis is obviously easier than scanning in two axes. Sometimes, the scanning is done using a MEMS mirror or a mirror on a galvanometer; other times it is a rotating hexagonal or polygon mirror. To avoid scanning all together, either a 2D array of detectors may be used, or a 2D array of emitters. The former is easier, and the optical source may be a single burst or strobe pulse, and a lensed system may image the reflected light onto a 2D detector. Information from each pixel of the detector may be used to compute the local time delay of the reflected light to the output burst and provide a depth reading. Ideally, a 2D array of sources that can be individually pulsed would be superior to a timed detector array, with better sensitivity and signal to noise. However, an array of very fast sources has been challenging to fabricate at high yield. Though vertical cavity surface emitting lasers should in theory be able to be used in this manner, the yields on large 2D arrays are poor since the lasing structure is complex, and effectively VCSELs cannot be used in this manner.

BRIEF SUMMARY OF THE INVENTION

Some embodiments provide a device for an optical time of flight system, comprising: a microLED comprising a p-doped region, an n-doped region, and an active region with doping; a photodetector in a silicon chip; and receiver circuitry in the silicon chip.

In some embodiments the doping of the active region is p-doping. In some embodiments the active region comprises at least two quantum wells separated by a barrier, and doping of the active region comprises doping of the barrier.

In some embodiments the microLED is bonded to the silicon chip. Some such embodiments further comprise pulse driver circuitry for the microLED, the pulse driver circuitry in the silicon chip.

In some embodiments the microLED is fabricated to emit light at about 420 nm. In some such embodiments the microLED has a 3 dB modulation bandwidth of at least one GigaHertz. Some such embodiments further comprise a reflector between the microLED and the silicon chip. Some such embodiments further comprise circuitry in the silicon chip to determine a time delay or phase of a signal received by the photodetector relative to a signal transmitted by the microLED.

In some embodiments the active region has at least two quantum wells separated by a p-doped barrier. In some embodiments the barrier in the microLED is p-doped with magnesium (Mg). In some such embodiments the Mg concentration is in the range of $5 \times 10^{19}/cm^3$-$5 \times 10^{20}/cm^3$.

In some embodiments the n-doped region has a doping concentration of $5 \times 10^{18}/cm^3$ to $1 \times 10^{19}/cm^3$. In some such embodiments the n-doped region is doped with silicon.

In some embodiments the p-doped regions comprise a p-doped AlGaN barrier, a p-doped GaN spacer, and a highly doped GaN or InGaN contact layer.

Some embodiments further comprise a plurality of microLEDs, each of the plurality of microLEDs comprising a p-doped region, an n-doped region, and an active region, the active region with at least two quantum wells separated by a p-doped barrier; and wherein the plurality of microLEDs and the microLED form an array of microLEDs. In some such embodiments the array of microLEDs is bonded to the silicon chip. Some such embodiments further comprise pulse driver circuitry for each microLED in the array of microLEDs.

These and other aspects of the invention are more fully comprehended upon review of this disclosure.

DETAILED DESCRIPTION

Some embodiments provide a structure and some embodiments provide a process to fabricate ToF sensors using microLEDs and CMOS-compatible detectors that operate at short wavelengths. In some embodiments the ToF sensors and/or detectors are very simple and low cost. In some embodiments the sensors have high signal to noise characteristics and/or are very low cost to manufacture.

In some embodiments microLEDs provide a light source. Generally, LEDs have not been fast enough to use for ToF applications. To measure down to a millimeter or centimeter, one generally needs a light source with time response faster than light can traverse such a distance. For centimeter resolution, this implies a time response <100 ps. Though pulses may not need to be that short, the rise time (or possibly fall time) of light turn on (or turn off) should be a sharp enough such that shifts in the reflected signal on the order of 100 ps can be detected. That corresponds to a bandwidth on the order of many GHz. Infrared or visible LEDs are generally limited to tens and possibly 100 MHz or so, and are therefore generally inappropriate for high resolution ToF applications. By contrast, a properly designed microLED, operating around 430 nm, can achieve 3 dB modulation bandwidths of many GHz and give high distance resolution for ToF applications. Furthermore, such devices can be formed easily into arrays for scalable power, from a single 2 um diameter device for low power applications to an array of thousands for high power ToF lidar. Such an array can be flashed simultaneously, to make a high power strobe pulse, or perhaps more interestingly, each element can be pulsed individually to form a x-y depth map. These light sources can be readily lifted off a native substrate such as sapphire and bonded onto a silicon chip containing drive electronics, making low cost individual elements, large arrays for a synchronized pulse, or an array where each pixel is pulsed separately.

Figure 1:
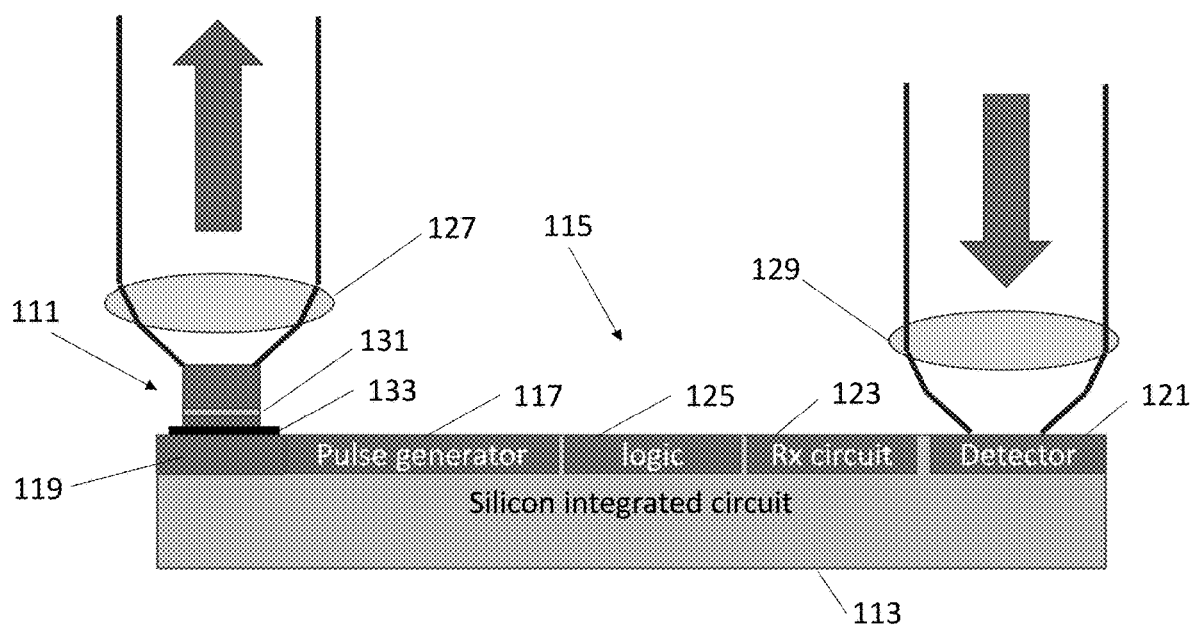
FIG. 1 shows a semi-block diagram, semi-schematic of a ToF sensor in accordance with aspects of the invention.

FIG. 1 shows a semi-block diagram, semi-schematic of a ToF sensor in accordance with aspects of the invention. A microLED 111 is bonded to a silicon chip 113 containing circuitry 115 enabling ToF measurements. The microLED is the light source for the ToF sensor, and the microLED may be an InGaN microLED. In some embodiments, the microLED is bonded to the chip using solder, thermal compression bonding, or Van der Waals forces. In FIG. 1, a lower reflector 133 is between the microLED and material of the silicon chip, and the microLED has InGaN quantum wells 131.

The ToF measurement circuitry on the silicon chip comprises five functional blocks. One block comprises a pulse generator 117. The pulse generator drives a microLED driver 119 that provides electrical drive to the microLED. Received light is detected by a block comprising an integrated photodetector 121. The output of the photodetector is connected to a receiver circuitry block 123 comprising a transimpedance amplifier (TIA) and a limiting amplifier to output logic-level signals. A logic block 125 computes the time delay or the phase of the received signal relative to that transmitted by the microLED. In some embodiments, transmitting 127 and/or receiving optics 129 are used to increase the transmitted beam brightness and/or the amount of light incident on the photodetector.

In some embodiments the microLED is a short wavelength microLED. First, by proper design, the microLED can be made very fast. In some embodiments the photodetectors are implemented in silicon, in some embodiments integrated on the same chip with a pulse generator, LED driver, receiver amplifier, and time delay computation logic circuitry. In some embodiments the photodetectors are simple and/or have a high signal-to-noise ratio.

Figure 2A:
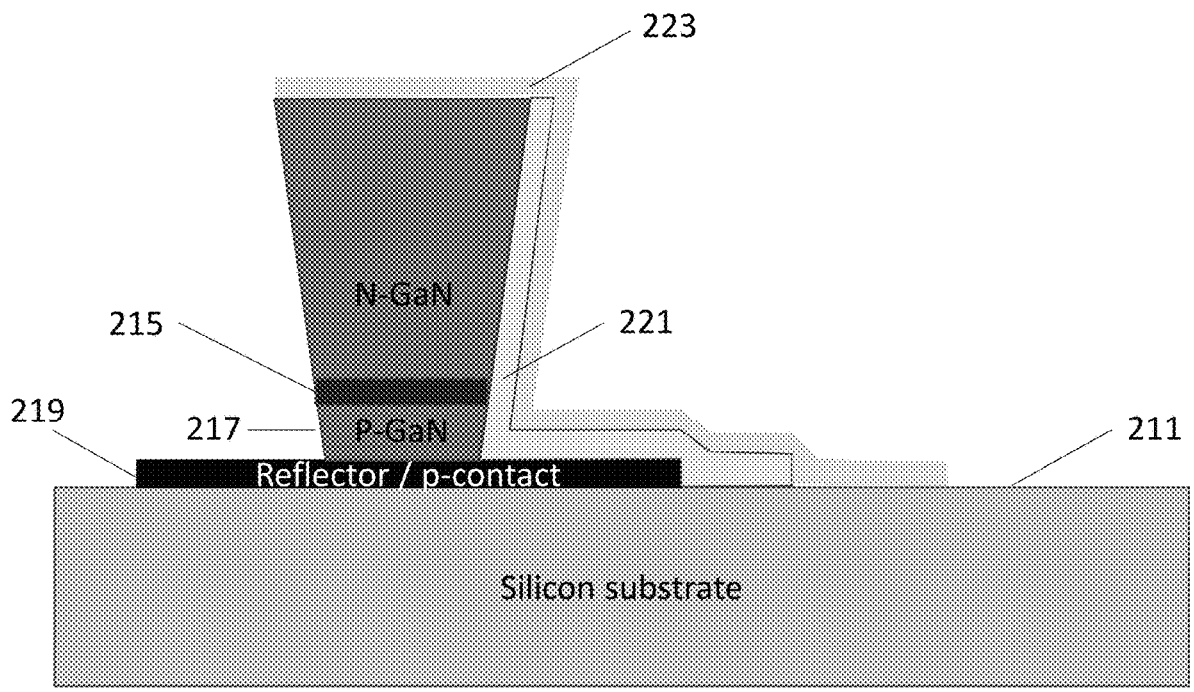
FIG. 2A shows a schematic of a GaN microLED, in accordance with aspects of the invention.

FIG. 2A shows a schematic of a GaN microLED. The GaN microLED may be used as the microLED of the ToF sensor of FIG. 1. To make such a microLED, epitaxial MOCVD growth is done on a substrate. In some embodiments, the substrate is sapphire, which may be patterned or unpatterned. In some embodiments, the substrate may be silicon. In some embodiments, the substrate may be GaN.

The GaN microLED structure comprises, and in some embodiments consists of, an n-doped region 213, an active region 215, and a p-doped region 217. In some embodiments, the epitaxially-grown n-doped region is relatively thick, on the order of 4 um. In some embodiments, this region contains superlattices to improve the material quality. In some embodiments, the n-type GaN doping concentration is in the range of $5 \times 10^{18}/cm^3$ to $1 \times 10^{19}/cm^3$ with silicon as the donor.

In some embodiments, the active region comprises two to five InGaN quantum wells (QWs) separated by GaN barriers. In some embodiments, quantum well widths are in the 2 nm-3 nm range and the barriers are approximately 10 nm wide. In some embodiments, the barriers are p-doped with magnesium (Mg) with a concentration in the range of $5 \times 10^{19}/cm^3$-$5 \times 10^{20}/cm^3$. The purpose of this doping is to reduce the carrier recombination time and thus increase the device's modulation bandwidth. By doping the barriers rather than the quantum wells, the Mg is easily activated, providing a high concentration of holes in the quantum wells. In some embodiments the microLEDs, or aspects of the microLEDs, are as discussed in U.S. Provisional Patent Application 63/060,944, entitled Enhanced MicroLEDs for Inter-Chip Communications, the disclosure of which is incorporated by reference herein.

The p-doped region is grown above the active region. In some embodiments, the p-doped region comprises a p-doped AlGaN electron barrier, a p-doped GaN spacer, and then a highly doped GaN or InGaN contact layer. After the wafer is grown, it is annealed to remove the hydrogen.

The wafer is then processed via various semiconductor fabrication processes to create individual microLED devices. In some embodiments, the GaN is etched all the way down to the substrate forming very small pillars whose width is on the order of 2 um.

The microLED devices are transferred to a silicon substrate 211 containing the ToF measurement circuitry through a multi-step process. On the silicon substrate is a pad for each microLED. In some embodiments each pad acts as both a rear optical reflector and an electrical contract 219 for the p-side of the microLED. In some embodiments, the pad is made from Pt, Ag, or Al. In some embodiments the pad is a reflective conductive material.

In some embodiments, the microLED pillars on part of a microLED wafer, or on an entire microLED wafer, are bonded to the pads on the silicon substrate. In some embodiments, this bonding is accomplished using solder, thermal compression bonding, or Van der Waals forces. After this bonding process, the microLEDs are released from the substrate on which they were grown.

If the substrate material is sapphire, in some embodiments this release process is accomplished by a "laser lift-off" (LLO) process using a short, high peak power pulse from a laser whose light is highly transparent to the substrate but highly absorbed by the epitaxial GaN layers of the microLED. The laser is pulsed and its light is focused from the backside of the sapphire substrate to be absorbed in the GaN, causing the material to lift-off from the substrate. In some embodiments, the laser is an excimer laser with a wavelength in the 250 nm-300 nm range. In some embodiments, the laser is a diode-pumped solid state laser or a fiber laser with a wavelength in the 350 nm range.

In some embodiments, the microLEDs are transferred from their original substrate onto the silicon substrate using stamping technology, printing technology, or epitaxial lift-off. All of these methods are relatively well known in the art and used for the fabrication of microLED displays.

Figure 2B:
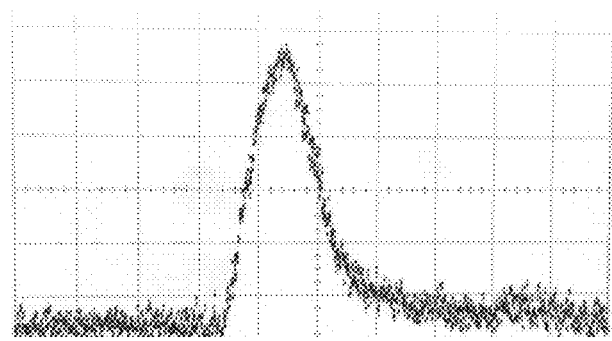
FIG. 2B shows a measured optical pulse generated by a microLED, such as the microLED of FIG. 2A, fabricated to emit light at about 420 nm.

Once the GaN microLEDs are transferred to the silicon, an insulating layer 221 and a top or n-contact 223 are added, which allows each microLED to be driven by the microLED circuitry in the silicon substrate. The top contact is generally transparent, and may be, e.g., of ITO. As shown in the example of FIG. 2A, the insulating layer is an insulating dielectric, for example SiN, and is along one side of the pillar forming the microLED. The top contact extends generally across an exposed top of the n-doped GaN region, and down to the silicon substrate. The insulating dielectric also separates the p-contact and the n-contact about the silicon substrate. The microLEDs can be optimized for speed by making their size small, which enables low capacitance and high current density. In some embodiments a small size is less than 10 um, in some embodiments less than 5 um, in some embodiments less than or equal to 4 um, and in some embodiments less than or equal to 2 um. In some embodiments, for example as noted herein, high doping levels in the active layers, for example the p-doping of the barriers mentioned above, serve to increases modulation bandwidth of the microLEDs, and for microLEDs may be of more importance than low capacitance with regard to speed of operation. FIG. 2B shows a measurement of an optical pulse generated by such a microLED fabricated to emit light at about 420 nm. The wall plug efficiency is about 20%, and the rise time is <200 ps. Received pulse delays can be discriminated with about a 20 ps resolution, which for a reflected beam gives a distance resolution of a few millimeters.

Figure 3A:
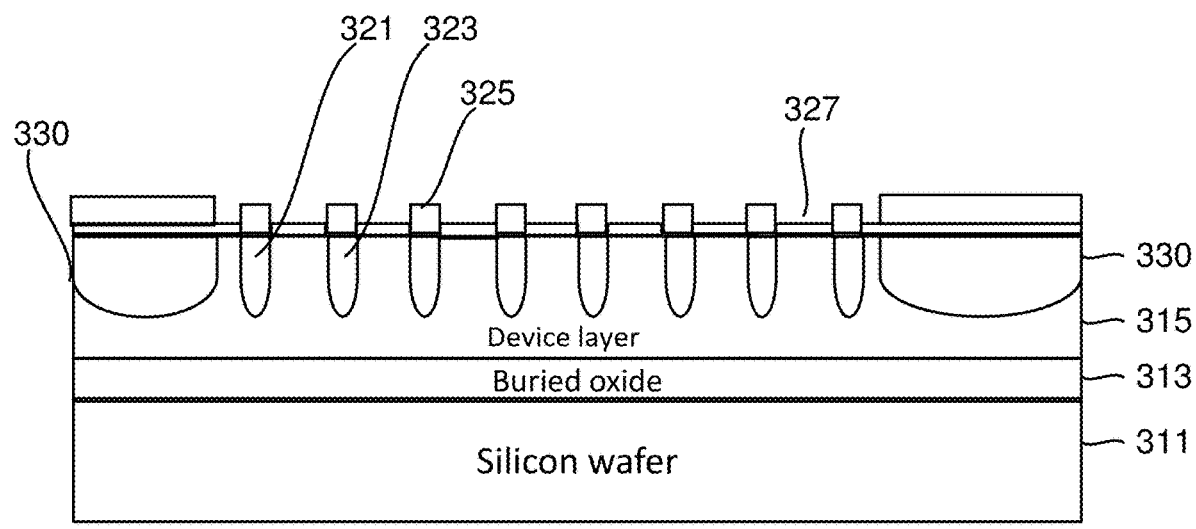
FIGS. 3A-B show a cross-sectional side view and a top view, respectively, of a CMOS-compatible detector that may be monolithically integrated with silicon ToF circuitry, in accordance with aspects of the invention.

In some embodiments photodetectors are monolithically integrated with the silicon ToF circuitry; this monolithic silicon integration is enabled by the short wavelength of operation. The absorption depth of 420 nm light in silicon is less than 0.2 um, a distance compatible with typical implant/diffusion length of CMOS drain and source contacts. FIGS. 3A and B show such a CMOS-compatible detector. In some embodiments the detector is as discussed in U.S. Provisional patent application 63/047,694, entitled CMOS-Compatible Short Wavelength Photodetectors, the disclosure of which is incorporated by reference herein. In the CMOS-compatible detector of FIGS. 3A-B, the p-i-n diode is lateral, with the n and p sections being the same as the source and drain contacts of PMOS and NMOS transistors. Such a detector can easily be integrated with a transimpedance amplifier (TIA) and other silicon electronics.

Figure 3B:
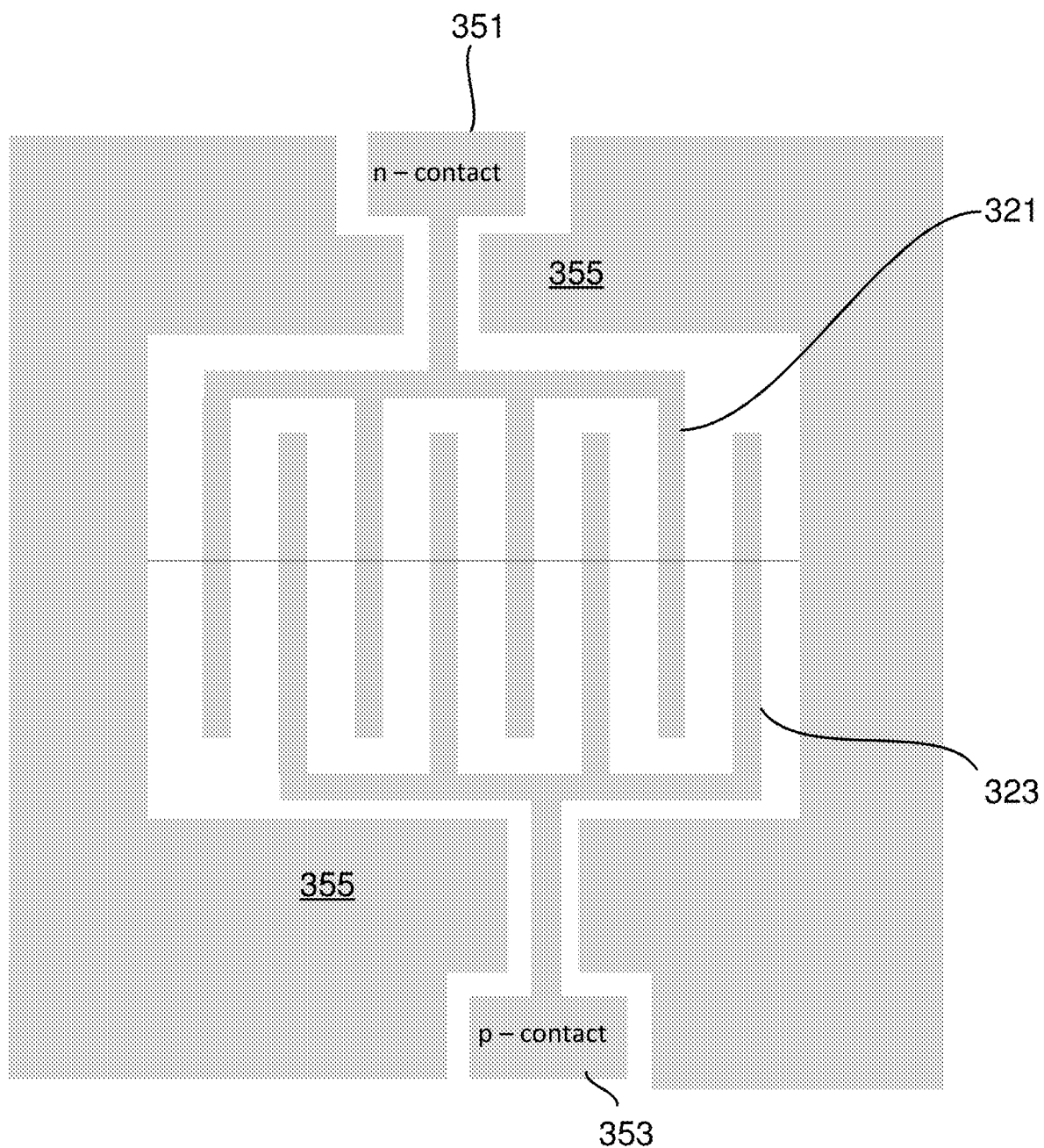

FIG. 3A shows a vertical structure and FIG. 3B shows a top view of example interdigitated contacts of p+ and n+ with lightly doped semiconductor in between. As may be seen in FIG. 2A, a silicon wafer 311 includes a device layer 315 about its upper portion. The device layer includes n-fingers 321 interspersed with p-fingers. The n-fingers may be made at the same time as source and drain contacts of an NMOS transistor. Similarly, the p-fingers may be made at the same time as source and drain contacts of a PMOS transistor. The n-fingers and the p-fingers are part of a lateral p-i-n photodetector. The p-fingers are connected to a p-contact 353, and the n-fingers are connected to an n-contact 351 When the device is reverse biased, the intrinsic region is depleted and an electric field sweeps out the carriers. Typical distance between the fingers would be 1-2 microns, while finger width would be minimized to be 0.5 um or less. In some embodiments, areas between the fingers may have an anti-reflective coating 327, for example an oxide anti-reflective coating. Any light that falls on the fingers does not generate significant photocurrent. If the fingers are metalized 325, this is because the light is reflected or absorbed by the metal. Even if the fingers are unmetallized, there is no significant electric field in doped regions and thus any photogenerated carriers are not separated and do not generate photocurrent.

The addition of a buried oxide layer 313 increases the speed of the photodetector because any carriers generated deep within the wafer are not collected. The buried oxide layer is shown in FIG. 3A as being at least vertically under a photodetector region. The electric field is weak deep down in the semiconductor, so any deep carriers are not swept out fast and would generate a slow tail on the photodetector response if collected; the buried oxide prevents these slow, deep carriers from being collected. In some embodiments thickness of the buried oxide layer is reflective at a wavelength of light incident on the photodetector. Any light that reaches the buried oxide layer and is reflected may be subsequently absorbed, increasing the photodetector's quantum efficiency. In some embodiments thickness of the buried oxide layer is reflective at a wavelength of operation. In some embodiments thickness of the buried oxide layer is reflective for at least some wavelengths equal to n/2*(buried oxide layer thickness)/(oxide refractive index), where n is an integer and wavelength is expected wavelength of light incident on the photodetector.

In some embodiments, the photodetector structure comprises a buried doped layer instead of a buried oxide layer. This buried doped layer may be fabricated as an n-type implant or p-type implant. This layer serves a similar purpose to that of a buried oxide layer: any carriers generated deeper than the layer are not collected by p-i-n detector structure. In some embodiments, the buried doped layer may not be electrically connected to other structures such that it is electrically floating. In some embodiments, a p-type buried implant layer may touch the p-type fingers of the photodetector. In some embodiment, an n-type buried implant layer may touch the n-fingers of the photodetector such that it is at the same voltage as the n-type fingers.

Similarly, preferably the detector is not illuminated outside the region of the fingers. For this reason, it is preferred both to block off the light away from the finger region with metal 355, for example, and also dope the regions 330 outside, in some embodiments at edges of, the detector, for example with a p-type implant, although in some embodiments an n-type implant may be used. This is shown in FIG. 3A where doping is outside the fingers. The buried oxide layer, the buried doped layer, and the edge implants, individually or in various combinations, can be considered a photodetector isolation structure.

The short absorption length can also be useful in other silicon detector configurations known in the art. In some embodiments, the photodetectors are vertical p-i-n diodes. In some embodiments, the photodetectors are APDs. In some embodiments, the photodetectors are SPADs.

Figure 4:
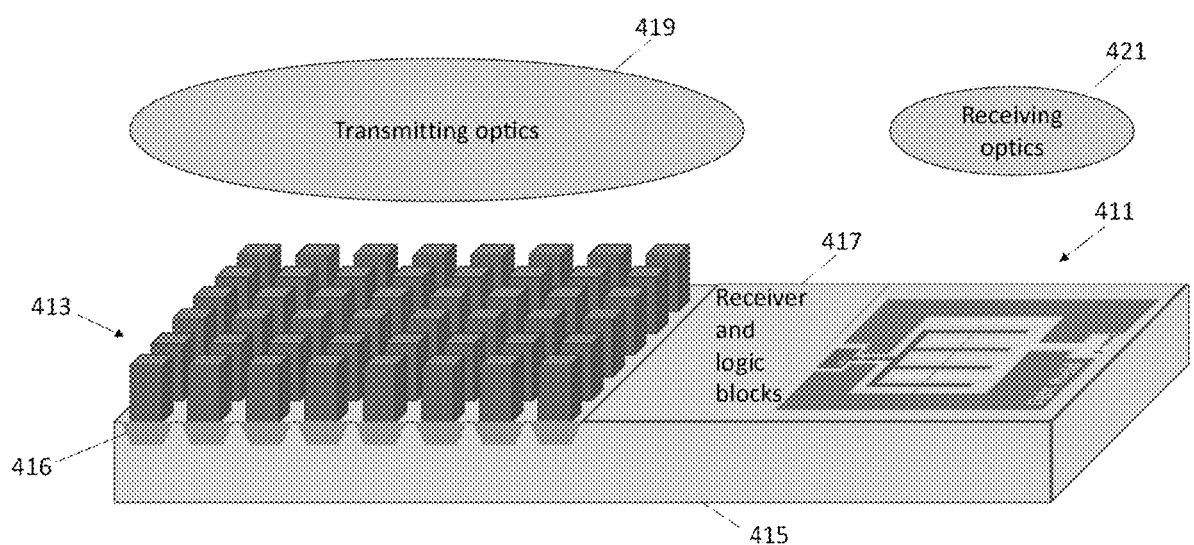
FIG. 4 shows an array of pulsed light sources integrated with a single detector, in accordance with aspects of the invention.

One advantage of microLEDs is that they utilize a very simple structure that can be produced with very high yield. This enables system utilizing large arrays of microLEDs where individual pixels are pulsed in order to form a 2D depth map of the environment. This is shown schematically in FIG. 4. FIG. 4 shows an array of pulsed light sources integrated with a single detector 411. The detector may the detector discussed with respect to FIGS. 3A-B. An array of microLEDs 413 may be fabricated on sapphire and then transferred onto a silicon IC 415, for example as discussed herein. The microLEDs may be microLEDs as discussed with respect to FIG. 2A. Each microLED is pulsed by its pulse driver circuit 416, so that the microLEDs generate an optical output. The silicon IC includes circuitry for logic and receiver blocks 417. The logic circuitry sequentially activates each pulse driver and such that one microLED (or a sub-group or subarray of microLEDs) is pulsed at a time. Output optical elements 419 such as lenses cause the light from each microLED to form a roughly collimated beam, but with the light from each microLED propagating at a different angle, in some embodiments. Once the beam hits an object and is reflected or scattered, the returning light is received by light collection optics 421 (typically lenses and/or mirrors) and imaged onto the single photodetector. The time of flight or phase is calculated, for example by the ToF measurement circuitry, which may be of the silicon IC, for each pulse. Knowing the angle at which each output pulse was launched, the logic circuit can calculate the reflection distance at each angle, forming a depth map of the environment.

Figure 5:
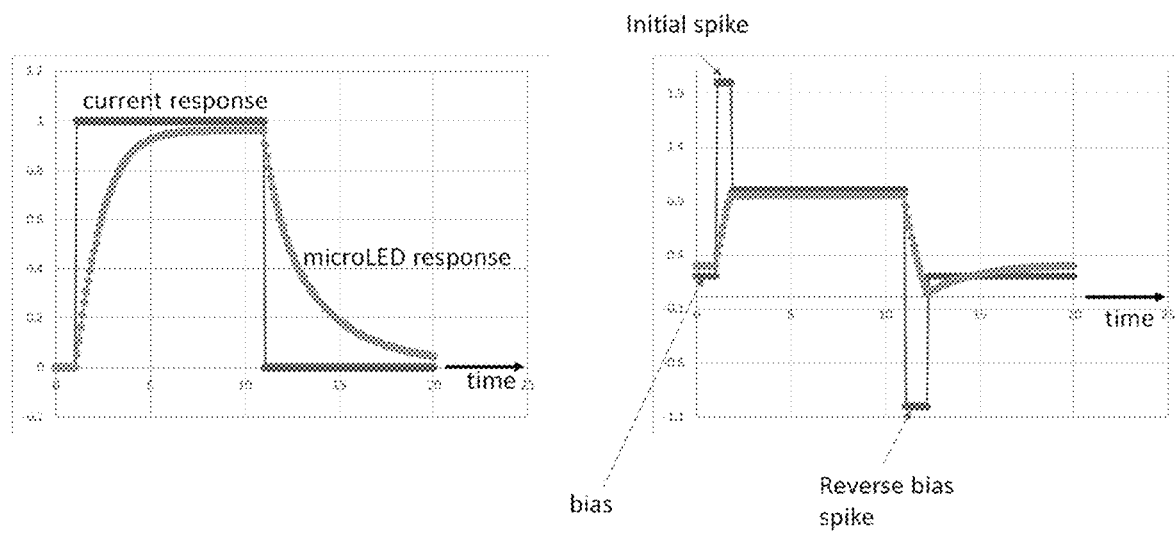
FIG. 5 provides graphs showing a microLED optical response to a square current pulse and to a shaped current pulse, in accordance with aspects of the invention.

For highest speed, a short fast pulse should be delivered to the microLED, with better (e.g., smaller) depth resolution being obtained for shorter optical pulses and/or optical pulses with faster rise/fall times. Faster microLED response can be obtained by properly shaping the pulse. FIG. 5 provides graphs showing a microLED optical response to a square current pulse and to a shaped current pulse. FIG. 5 shows how a different pulse shape can shorten the rise/fall time and or length of an optical pulse. Generally, the fastest LED modulation speed occurs when the injected carrier density is high. In some embodiments, the microLED is biased to emit light at all times, which ensures the injected carrier density is always above some minimum value; this technique is very similar to that used with lasers, where there is a turn-on delay.

In some embodiments, in addition to, or instead of, biasing the microLED, one can deliver a higher than normal current drive "spike" at turn-on, for example as illustrated with the shaped current pulse of FIG. 5. The sharp tall turn-on spike leads to a faster rise time. In some embodiments, this is accomplished with analog drive circuitry, which in some embodiments takes the derivative of an original pulsed drive signal to generate the spike and adds the spike to the original signal. In some embodiments, the spike is generated digitally.

In some embodiments, the fall-time is decreased, for example by putting a reverse bias on the diode at the end of the pulse, also for example as illustrated with the shaped current pulse of FIG. 5. This sweeps the carriers in the diode, leading to a faster fall-time.

There are numerous additions and embellishments that can further improve the ToF sensor or aspects of the ToF sensor.

In some embodiments, a narrowband optical filter is placed before the optical input of the detector. This filter eliminates, or reduces, background light and improves the detected signal-to-noise ratio (SNR). The spectral width of the microLED is relatively narrow, and thus a narrowband filter matched to the LED's emitted spectrum can be very effective in reducing background noise.

In some embodiments, reflectors can be added around the sides of each microLED. This can improve the collection of the light from the LED into the forward direction, giving higher efficiency and brightness, and resulting in higher received signal levels and better receiver SNR. In some embodiments the reflectors may be parabolic.

In some embodiments, a roughly spherical or dome-shaped encapsulant layer is formed around each LED. As the index of refraction of the encapsulant is increased (up to a maximum value equal to that of the LED's index), the light extraction efficiency (LEE) and thus the external optical power from the LED is increased.

In some embodiments, a small microlens is placed at the output of each microLED to increase its forward brightness.

In some embodiments, multiple separate chips are used to implement the ToF circuitry, which can reduce the electrical cross-talk and interference between the transmitter and receiver parts of the ToF system. In some embodiments, these chips are fabricated using two or more different IC fabrication processes, allows each chip to utilize an optimal process. In some embodiments, the chip to which the microLED(s) are bonded are mounted to an entirely different substrate for the best possible isolation.

There are numerous embellishments to the logic circuitry. In some embodiments, digital signal processing (DSP) circuitry is used for generating the pulses and/or for computing distances. In some embodiments, the entire array of microLEDs is flashed simultaneously, or subarrays are flashed together, to trade-off sensitivity for resolution. In some embodiments, the logic circuitry first does a low resolution scan of the entire environment, and then does high resolution scans of regions of interest. In some embodiments these more complex modes of operation are controlled and communicated via a digital interface from the ToF system to the outside world.

Although the invention has been discussed with respect to various embodiments, it should be recognized that the invention comprises the novel and non-obvious claims supported by this disclosure.

What is claimed is:

1. Device for an optical time of flight system, comprising:
 a GaN microLED comprising a p-doped region, an n-doped region, and an active region with doping;
 a photodetector in a silicon chip; and
 receiver circuitry in the silicon chip;
 wherein the microLED is fabricated to emit light at about 420 nm; and
 wherein the microLED has a 3 dB modulation bandwidth of at least one GigaHertz.

2. The device of claim 1, wherein the doping of the active region is p-doping.

3. The device of claim 2, wherein the active region comprises at least two quantum wells separated by a barrier, and doping of the active region comprises doping of the barrier.

4. The device of claim 1, wherein the microLED is bonded to the silicon chip.

5. The device of claim 4, further comprising pulse driver circuitry for the microLED, the pulse driver circuitry in the silicon chip.

6. The device of claim 1, further comprising a reflector between the microLED and the silicon chip.

7. The device of claim 1, further comprising circuitry in the silicon chip to determine a time delay or phase of a signal received by the photodetector relative to a signal transmitted by the microLED.

8. The device of claim 1, wherein the active region has at least two quantum wells separated by a p-doped barrier.

9. The device of claim 8, wherein the barrier is p-doped with magnesium (Mg).

10. The device of claim 9, wherein the Mg concentration is in the range of $5\times10^{19}/cm^3$-$5\times10^{20}/cm^3$.

11. The device of claim 1, wherein the n-doped region has a doping concentration of $5\times10^{18}/cm^3$ to $1\times10^{19}/cm^3$.

12. The device of claim 11, wherein the n-doped region is doped with silicon.

13. The device of claim 1, wherein the p-doped regions comprises a p-doped AlGaN barrier, a p-doped GaN spacer, and a highly doped GaN or InGaN contact layer.

14. The device of claim 1, further comprising a plurality of GaN microLEDs, each of the plurality of microLEDs comprising a p-doped region, an n-doped region, and an active region, the active region with at least two quantum wells separated by a p-doped barrier; and
 wherein the plurality of microLEDs and the microLED form an array of microLEDs.

15. The device of claim 14, wherein the array of microLEDs is bonded to the silicon chip.

16. The device of claim 15, further comprising pulse driver circuitry for each microLED in the array of microLEDs.

* * * * *